US011066753B2

United States Patent
Hebert et al.

(10) Patent No.: US 11,066,753 B2
(45) Date of Patent: Jul. 20, 2021

(54) PLATED POLYMERIC ARTICLE INCLUDING TIN/COPPER TIE/SEED LAYER

(71) Applicant: 3M INNOVATIVE PROPERTIES COMPANY, St. Paul, MN (US)

(72) Inventors: Larry S. Hebert, Hudson, WI (US); David A. Sowatzke, Spring Valley, WI (US); Steven Y. Yu, St. Paul, MN (US); Gene B. Nesmith, Lago Vista, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 324 days.

(21) Appl. No.: 15/736,531

(22) PCT Filed: Jun. 13, 2016

(86) PCT No.: PCT/US2016/037261
§ 371 (c)(1),
(2) Date: Dec. 14, 2017

(87) PCT Pub. No.: WO2016/205137
PCT Pub. Date: Dec. 22, 2016

(65) Prior Publication Data
US 2018/0187323 A1  Jul. 5, 2018

Related U.S. Application Data

(60) Provisional application No. 62/180,356, filed on Jun. 16, 2015.

(51) Int. Cl.
| | | |
|---|---|---|
| B32B 15/04 | (2006.01) | |
| C25D 5/56 | (2006.01) | |
| C23C 28/02 | (2006.01) | |
| C23C 28/00 | (2006.01) | |
| C23C 14/20 | (2006.01) | |
| B32B 15/20 | (2006.01) | |
| C25D 3/38 | (2006.01) | |
| C23C 18/16 | (2006.01) | |
| C23C 18/54 | (2006.01) | |
| C25D 3/30 | (2006.01) | |

(52) U.S. Cl.
CPC ............ C25D 5/56 (2013.01); B32B 15/04 (2013.01); B32B 15/20 (2013.01); C23C 14/205 (2013.01); C23C 28/023 (2013.01); C23C 28/42 (2013.01); C23C 18/1653 (2013.01); C23C 18/54 (2013.01); C25D 3/30 (2013.01); C25D 3/38 (2013.01)

(58) Field of Classification Search
None
See application file for complete search history.

(56) References Cited

U.S. PATENT DOCUMENTS

| | | | |
|---|---|---|---|
| 3,314,771 A | 4/1967 | Herbert | |
| 3,967,044 A | 6/1976 | Brandt | |
| 4,522,889 A | 6/1985 | Ebneth | |
| 5,378,347 A | 1/1995 | Thomson | |
| 7,780,839 B2 | 8/2010 | Egli | |
| 8,503,153 B2 | 8/2013 | Hebert | |
| 8,922,970 B2 | 12/2014 | Hebert | |
| 2008/0199627 A1* | 8/2008 | Mitsumori | C23C 18/1605 427/437 |
| 2010/0215982 A1 | 8/2010 | Kohiki | |
| 2013/0171457 A1* | 7/2013 | Matsuda | C25D 1/04 428/447 |
| 2014/0293498 A1 | 10/2014 | Hebert | |

FOREIGN PATENT DOCUMENTS

| | | |
|---|---|---|
| GB | 1343 212 | 1/1974 |
| JP | H11-021673 | 1/1999 |
| JP | 2004/285417 | 3/2003 |
| JP | 2014-148562 | 8/2014 |
| WO | WO 2000/020656 | 4/2000 |
| WO | WO 2002/079542 | 10/2002 |
| WO | WO 2010/121044 | 10/2010 |
| WO | WO 2016/205134 | 12/2016 |

OTHER PUBLICATIONS

Capture of the Engineering Tool Box website, https://www.engineeringtoolbox.com/melting-points-mixtures-metals-d_1269.html dated Jan. 4, 2020. (Year: 2020).*
Chaim, R., "Effect of grain size on elastic modulus and hardness of nanocrystalline ZrO2-3wtT Y2O3 ceramic," *Journal of Materials Science*, vol. 39, pp. 3057-3061 (2004).
Gao, F., et al., "Calculating the diffusivity of Cu and SN in cu3Sn intermetallic by molecular dynamics simulations", *Materials Letters*, vol. 73, pp. 92-94 (2012).

(Continued)

*Primary Examiner* — Adam Krupicka
(74) *Attorney, Agent, or Firm* — Philip P. Soo

(57) ABSTRACT

A plated article is provided comprising a) a polymeric substrate bearing b) a tie/seed layer in direct contact with the polymeric substrate and c) a plated metal layer, wherein the tie/seed layer has a thickness of less than 0.95 µm, and wherein the tie/seed layer comprises two or more layers of tin alternating with two or more layers of copper, and in some embodiments up to ten or more layers of tin alternating with ten or more layers of copper. In some embodiments, the tie/seed layer includes a layer of tin in direct contact with the polymeric substrate. Typically, the layers of tin and copper comprising the tie/seed layer are sputter coated layers. In some embodiments, the plated metal layer comprises an alloy of copper and tin. In some embodiments, the plated metal layer comprises layers comprised of tin alternating with layers comprised of copper.

17 Claims, No Drawings

(56) References Cited

He, M., "Effect of Bi on the Interfacial Reaction between Sn-3.7AG-xBi Solders and Cu", *Journal of Electronic Materials*, vol. 37, No. 3, pp. 288-299 (2008).
Mandich, N.V., "Troubleshooting Decorative Bronze Plating Systems," *Metal Finishing*, vol. 101, No. 6., pp. 97-106, (2003).
Moshohoritou, R., "The Effects of Some Additives on the Throwing Power and Stability of Tin (II) Solutions during A-C Coloring of Anodized Aluminum Part I: Heterocyclic Organic Compounds," *Plating and Surface Finishing*, vol. 81, No. 1, pp. 60-64, (1994).
Murase, K., et al., "Preparation of Cu-Sn Layers on Polymer Substrate by Reduction-Diffusion Method Using Ionic Liquid Baths," *J. Electrochem. Soc.*, 158 (6), pp. D335-D341, (2011).
Nakamura, T., "Electrodeposition of CuSn Alloy from Noncyanide Sulfosuccinate Bath,", Materials Science Forum, vol. 654-656, pp. 1912-1915, (2010).
Schlesinger, M., et al., "Tin and Tin Alloys for Lead-Free Solder," *Modern Electroplating, Fifth Edition*, eds., NY, pp. 139-204 (2010).
Strow, H., "Brass and Bronze Plating," Metal Finishing, vol. 102, No. 4, pp. 169-173, (2004).
International Search Report for PCT/US2016/037256 dated Oct. 12, 2016 (5 pages).

\* cited by examiner

PLATED POLYMERIC ARTICLE INCLUDING TIN/COPPER TIE/SEED LAYER

CROSS REFERENCE TO RELATED APPLICATIONS

This application is a national stage filing under 35 U.S.C. 371 of PCT/US2016/037261, filed Jun. 13, 2016, which claims the benefit of U.S. Provisional Patent Application No. 62/180356, filed Jun. 16, 2015, the disclosures of which are incorporated by reference in their entirety herein.

FIELD OF THE DISCLOSURE

This disclosure relates to plated polymeric articles that make use of a tie/seed layer comprising alternating layers of tin and copper, typically sputter coated layers of tin and copper, borne on a polymeric substrate.

BACKGROUND OF THE DISCLOSURE

The following references may be relevant to the general field of technology of the present disclosure: "Brass and Bronze Plating," H. Strow, Metal Finishing, Vol. 102, No. 4, pp. 169-173, 2004; "Troubleshooting Decorative Bronze Plating Systems," N. V. Mandich, Metal Finishing, Vol. 101, No. 6., pp. 97-106, 2003; "The Effects of Some Additives on the Throwing Power and Stability of Tin (II) Solutions during A-C Coloring of Anodized Aluminum Part I: Heterocyclic Organic Compounds," by R. Moshohoritou, Plating and Surface Finishing, Vol. 81, No. 1, pp. 60-64, 1994; "Tin and Tin Alloys for Lead-Free Solder," Modern Electroplating, Fifth Edition, eds. M. Schlesinger, and M. Paunovic, N Y, 2010, pp. 139-204; "Reducing Tin Sludge in Acid Tin Plating," U.S. Pat. No. 5,378,347; "Electroplating Bronze," U.S. Pat. No. 7,780,839; Electrodeposition of CuSn Alloy from Noncyanide Sulfosuccinate Bath," T. Nakamura, Materials Science Forum, Vol. 654-656, pp. 1912-1915, 2010; and "Preparation of Cu—Sn Layers on Polymer Substrate by Reduction-Diffusion Method Using Ionic Liquid Baths," K. Murase et al., J. Electrochem. Soc., 158 (6), pp. D335-D341, 2011.

SUMMARY OF THE DISCLOSURE

Briefly, the present disclosure provides a plated article comprising a) a polymeric substrate bearing b) a tie/seed layer in direct contact with the polymeric substrate and c) a plated metal layer, wherein the tie/seed layer has a thickness of less than 0.95 µm, and wherein the tie/seed layer comprises two or more layers of tin alternating with two or more layers of copper. In some embodiments, the tie/seed layer comprises three or more layers of tin alternating with three or more layers of copper; in some four tin and four copper, in some five tin and five copper; in some seven tin and seven copper, in some nine tin and nine copper, and in some ten tin and ten copper. In some embodiments, the tie/seed layer includes a layer of tin in direct contact with the polymeric substrate. In some embodiments, the layers of tin comprising the tie/seed layer are sputter coated layers. In some embodiments, the layers of copper comprising the tie/seed layer are sputter coated layers. In some embodiments, the plated metal layer is in direct contact with the tie/seed layer. In some embodiments, the tie/seed layer bears a sputter coated top layer of copper having in direct contact with the tie/seed layer. In some such embodiments the top layer of copper has a thickness of less than 0.60 µm. In some such embodiments, the plated metal layer is in direct contact with the top layer of copper. In some embodiments, the plated metal layer comprises copper and tin in an atomic ratio of less than 96:4, in some less than 87:13 and in some less than 82:18. In some embodiments, the polymeric substrate comprises a thermoplastic polymer, in others, a polymer derived from an epoxy resin. In some embodiments, the plated metal layer comprises an alloy of copper and tin having a melting point of less than 800° C. In other embodiments, the plated metal layer comprises layers comprised of tin alternating with layers comprised of copper; in some at least two layers comprised of tin and at least two layers comprised of copper. Additional embodiments of the plated article of the present disclosure are described below under "Selected Embodiments."

In another aspect, the present disclosure provides a resin matrix-fiber composite part comprising the plated article according to the present disclosure. In some embodiments, the plated article forms a surface of the resin matrix-fiber composite part. In some embodiments, the polymeric substrate forms the outermost surface of the resin matrix-fiber composite part. Alternately, in some embodiments, the polymeric substrate is bound directly to the resin matrix of the resin matrix-fiber part. Additional embodiments of the resin matrix-fiber composite part of the present disclosure are described below under "Selected Embodiments."

All scientific and technical terms used herein have meanings commonly used in the art unless otherwise specified. The definitions provided herein are to facilitate understanding of certain terms used frequently herein and are not meant to limit the scope of the present disclosure.

As used in this specification and the appended claims, the singular forms "a", "an", and "the" encompass embodiments having plural referents, unless the content clearly dictates otherwise.

As used in this specification and the appended claims, the term "or" is generally employed in its sense including "and/or" unless the content clearly dictates otherwise.

As used herein, "have", "having", "include", "including", "comprise", "comprising" or the like are used in their open ended sense, and generally mean "including, but not limited to." It will be understood that the terms "consisting of" and "consisting essentially of" are subsumed in the term "comprising," and the like.

DETAILED DESCRIPTION

The present disclosure provides plated polymeric articles that make use of a tie/seed layer comprising alternating layers of tin and copper, typically sputter coated layers of tin and copper, borne on a polymeric substrate. In some embodiments, the plated metal layer of the plated article is borne directly on the tie/seed layer. In other embodiments, the article includes other layers intermediate between the plated metal layer and the tie/seed layer, e.g., a sputter coated top layer of copper.

In some embodiments, the plated metal layer of the plated article is as essentially homogeneous alloy. U.S. Pat. App. No. 62/180,352, (Atty. Docket No. 76541US002), filed on even date herewith, discloses bronze alloys and methods of plating such bronze alloys which may be used in the plated metal layer of the plated article according to this disclosure.

In some embodiments, the plated metal layer of the plated article comprises alternating plated layers of tin and copper. Any suitable plating method may be used, including electroplating, electroless plating and immersion plating. Typically, copper is electroplated, but it may also be electroless plated. Typically, tin is immersion plated, but it may also be electroplated.

The authors have found that plated metal layers comprising the bronze alloys described above or the alternating tin-copper layered constructions described above may be of particular interest since they may have high electrical conductivity and high corrosion resistance yet reduced melting point relative to pure copper, and thus may be useful in the lightning protection sheets described in, e.g., U.S. Pat. No. 8,922,970, issued Dec. 30, 2014; U.S. Pat. No. 8,503,153, issued Aug. 6, 2013; U.S. Pat. No. 8,503,153, issued Jun. 24, 2014; and US Publ. No. 2014/0293498, filed Jun. 12, 2014; the contents of which are incorporated herein by reference. Copper alone is of limited utility in such an application due to its melting point of about 1085° C., which is higher than ideal. For use in such an application, a conductor with a lower melting point is more useful, preferably less than 1050° C., more preferably less than 1000° C., more preferably less than 900° C., and most preferably less than 800° C. In contrast, a bronze containing a 95/5 atomic ratio of Cu/Sn has a melting point of about 1010° C. and a bronze containing a 80/20 atomic ratio of Cu/Sn has a melting point of about 750° C., making these bronzes more useful in lightning protection sheets such as those described in the patents cited above. Furthermore, layered tin/copper structures may also behave as lower-melting materials when subject to high currents and voltages used to test lightning strike performance.

The authors have found that the durability of the plated article according to the present disclosure can be enhanced by the use of the appropriate tie/seed layer, i.e., a layer performing the functions of both a tie layer (serving to increase binding between the electroplated layer and the polymeric substrate) and a seed layer (serving to impart sufficient conductivity to the polymer substrate to enable electroplating on the polymer substrate). The tie/seed layer may be applied by any suitable method, but is typically applied by sputtering or vacuum deposition. The tie/seed layer typically comprises numerous alternating layers of tin and copper, typically starting with tin and ending with copper.

Selected Embodiments

The following embodiments, designated by letter and number, are intended to further illustrate the present disclosure but should not be construed to unduly limit this disclosure.

TS1. A plated article comprising
  a) a polymeric substrate bearing
  b) a tie/seed layer in direct contact with the polymeric substrate and
  c) a plated metal layer,
wherein the tie/seed layer has a thickness of less than 0.95 µm, and
wherein the tie/seed layer comprises two or more layers of tin alternating with two or more layers of copper.

TS2. The plated article according to any of the preceding embodiments wherein the tie/seed layer has a thickness of less than 0.90 µm.

TS3. The plated article according to any of the preceding embodiments wherein the tie/seed layer has a thickness of less than 0.85 µm.

TS4. The plated article according to any of the preceding embodiments wherein the tie/seed layer has a thickness of less than 0.80 µm.

TS5. The plated article according to any of the preceding embodiments wherein the tie/seed layer has a thickness of less than 0.75 µm.

TS6. The plated article according to any of the preceding embodiments wherein the tie/seed layer comprises three or more layers of tin alternating with three or more layers of copper.

TS7. The plated article according to any of the preceding embodiments wherein the tie/seed layer comprises four or more layers of tin alternating with four or more layers of copper.

TS8. The plated article according to any of the preceding embodiments wherein the tie/seed layer comprises five or more layers of tin alternating with five or more layers of copper.

TS9. The plated article according to any of the preceding embodiments wherein the tie/seed layer comprises seven or more layers of tin alternating with seven or more layers of copper.

TS10. The plated article according to any of the preceding embodiments wherein the tie/seed layer comprises nine or more layers of tin alternating with nine or more layers of copper.

TS11. The plated article according to any of the preceding embodiments wherein the tie/seed layer comprises ten or more layers of tin alternating with ten or more layers of copper.

TS12. The plated article according to any of the preceding embodiments wherein the tie/seed layer includes a layer of tin in direct contact with the polymeric substrate.

TS13. The plated article according to any of the preceding embodiments wherein the tie/seed layer includes a layer of copper which is the layer of the tie/seed layer most distant from the polymeric substrate.

TS14. The plated article according to any of the preceding embodiments wherein the layers of tin comprising the tie/seed layer are sputter coated layers.

TS15. The plated article according to any of the preceding embodiments wherein the layers of copper comprising the tie/seed layer are sputter coated layers.

TS16. The plated article according to any of the preceding embodiments wherein the plated metal layer is in direct contact with the tie/seed layer.

TS17. The plated article according to any of embodiments TS1-TS15 wherein the tie/seed layer bears a sputter coated top layer of copper having in direct contact with the tie/seed layer.

TS18. The plated article according to embodiment TS17 wherein the top layer of copper has a thickness of less than 0.60 µm.

TS19. The plated article according to embodiment TS17 wherein the top layer of copper has a thickness of less than 0.50 µm.

TS20. The plated article according to embodiment TS17 wherein the top layer of copper has a thickness of less than 0.45 µm.

TS21. The plated article according to any of embodiments TS17-TS20 wherein the plated metal layer is in direct contact with the top layer of copper.

TS22. The plated article according to any of the preceding embodiments wherein the plated metal layer comprises copper and tin in an atomic ratio of less than 96:4.

TS23. The plated article according to any of the preceding embodiments wherein the plated metal layer comprises copper and tin in an atomic ratio of less than 92:8.

TS24. The plated article according to any of the preceding embodiments wherein the plated metal layer comprises copper and tin in an atomic ratio of less than 87:13.

TS25. The plated article according to any of the preceding embodiments wherein the plated metal layer comprises copper and tin in an atomic ratio of less than 82:18.

TS26. The plated article according to any of the preceding embodiments wherein the plated metal layer comprises copper and tin in an atomic ratio of less than 78:22.

TS27. The plated article according to any of the preceding embodiments wherein the plated metal layer comprises copper and tin in an atomic ratio of less than 76:24.

TS28. The plated article according to any of the preceding embodiments wherein the plated metal layer comprises copper and tin in an atomic ratio of less than 73:27.

TS29. The plated article according to any of the preceding embodiments wherein the plated metal layer comprises copper and tin in an atomic ratio of less than 71:29.

TS30. The plated article according to any of the preceding embodiments wherein the plated metal layer comprises copper and tin in an atomic ratio of greater than 55:45.

TS31. The plated article according to any of the preceding embodiments wherein the plated metal layer comprises copper and tin in an atomic ratio of greater than 65:35.

TS32. The plated article according to any of the preceding embodiments wherein the plated metal layer comprises copper and tin in an atomic ratio of greater than 68:32.

TS33. The plated article according to any of the embodiments TS1-TS32 wherein the polymeric substrate comprises a thermoplastic polymer.

TS34. The plated article according to any of embodiments TS1-TS32 wherein the polymeric substrate comprises a thermoset polymer.

TS35. The plated article according to any of embodiments TS1-TS32 wherein the polymeric substrate comprises a polyolefin polymer.

TS36. The plated article according to any of embodiments TS1-TS32 wherein the polymeric substrate comprises a polypropylene polymer.

TS37. The plated article according to any of embodiments TS1-TS32 wherein the polymeric substrate comprises a polyester polymer.

TS38. The plated article according to any of embodiments TS1-TS32 wherein the polymeric substrate comprises a polyurethane polymer.

TS39. The plated article according to any of embodiments TS1-TS32 wherein the polymeric substrate comprises a polymer derived from an epoxy resin.

TS40. The plated article according to any of embodiments TS1-TS39 wherein the polymeric substrate has a thickness of less than 1400 μm.

TS41. The plated article according to any of embodiments TS1-TS39 wherein the polymeric substrate has a thickness of less than 420 μm.

TS42. The plated article according to any of embodiments TS1-TS39 wherein the polymeric substrate has a thickness of less than 280 μm.

TS43. The plated article according to any of embodiments TS1-TS39 wherein the polymeric substrate has a thickness of less than 140 μm.

TS44. The plated article according to any of embodiments TS1-TS39 wherein the polymeric substrate has a thickness of less than 70 μm.

TS45. The plated article according to any of the preceding embodiments wherein the plated metal layer has a thickness of greater than 3.0 μm.

TS46. The plated article according to any of the preceding embodiments wherein the plated metal layer has a thickness of greater than 6.0 μm.

TS47. The plated article according to any of the preceding embodiments wherein the plated metal layer has a thickness of greater than 8.0 μm.

TS48. The plated article according to any of the preceding embodiments wherein the polymeric substrate is a flexible polymer sheet.

TS49. The plated article according to any of the preceding embodiments wherein the plated metal layer has a Young's Modulus of less than 15.0 GPa.

TS50. The plated article according to any of the preceding embodiments wherein the plated metal layer has a Young's Modulus of less than 13.0 GPa.

TS51. The plated article according to any of the preceding embodiments wherein the plated metal layer has a Young's Modulus of less than 11.0 GPa.

TS52. The plated article according to any of the preceding embodiments wherein the plated metal layer has a Young's Modulus of less than 10.0 GPa.

B1. The plated article according to any of embodiments TS1-TS52 wherein the plated metal layer comprises an alloy of copper and tin.

B2. The plated article according to embodiment B1 wherein the alloy is substantially uniform throughout the thickness of the plated metal layer.

B3. The plated article according to any of embodiments B1-B2 wherein the plated metal layer is an electroplated metal layer.

B4. The plated article according to any of embodiments B1-B3 wherein the plated metal layer comprises an alloy having a melting point of less than 1050° C.

B5. The plated article according to any of embodiments B1-B3 wherein the plated metal layer comprises an alloy having a melting point of less than 1000° C.

B6. The plated article according to any of embodiments B1-B3 wherein the plated metal layer comprises an alloy having a melting point of less than 900° C.

B7. The plated article according to any of embodiments B1-B3 wherein the plated metal layer comprises an alloy having a melting point of less than 800° C.

B8. The plated article according to any of embodiments B1-B7 wherein the plated metal layer additionally comprises greater than 0.001 weight % zinc.

B9. The plated article according to any of embodiments B1-B7 wherein the plated metal layer additionally comprises greater than 0.005 weight % zinc.

B10. The plated article according to any of embodiments B1-B7 wherein the plated metal layer additionally comprises greater than 0.010 weight % zinc.

B11. The plated article according to any of embodiments B1-B10 wherein the plated metal layer additionally comprises greater than 0.01 weight % sulfur.

B12. The plated article according to any of embodiments B1-B10 wherein the plated metal layer additionally comprises greater than 0.05 weight % sulfur.

B13. The plated article according to any of embodiments B1-B10 wherein the plated metal layer additionally comprises greater than 0.10 weight % sulfur.

L1. The plated article according to any of embodiments TS1-TS52 wherein the plated metal layer comprises layers comprised of tin alternating with layers comprised of copper.

L2. The plated article according to embodiment L1 wherein the plated metal layer comprises at least two layers comprised of tin.

L3. The plated article according to any of embodiments L1-L2 wherein the plated metal layer comprises at least two layers comprised of copper.
L4. The plated article according to any of embodiments L1-L3 wherein the plated metal layer comprises at least three layers comprised of tin.
L5. The plated article according to any of embodiments L1-L4 wherein the plated metal layer comprises at least three layers comprised of copper.
L6. The plated article according to any of embodiments L1-L5 wherein the copper layers are electroplated layers.
L7. The plated article according to any of embodiments L1-L6 wherein the tin layers are immersion plated layers.
L8. The plated article according to any of embodiments L1-L7 wherein the layers comprised of tin are at least 60 weight % tin.
L9. The plated article according to any of embodiments L1-L7 wherein the layers comprised of tin are at least 70 weight % tin.
L10. The plated article according to any of embodiments L1-L7 wherein the layers comprised of tin are at least 80 weight % tin.
L11. The plated article according to any of embodiments L1-L7 wherein the layers comprised of tin are at least 90 weight % tin.
L12. The plated article according to any of embodiments L1-L7 wherein the layers comprised of tin are at least 95 weight % tin.
L13. The plated article according to any of embodiments L1-L12 wherein the layers comprised of copper are at least 60 weight % copper.
L14. The plated article according to any of embodiments L1-L12 wherein the layers comprised of copper are at least 70 weight % copper.
L15. The plated article according to any of embodiments L1-L12 wherein the layers comprised of copper are at least 80 weight % copper.
L16. The plated article according to any of embodiments L1-L12 wherein the layers comprised of copper are at least 90 weight % copper.
L17. The plated article according to any of embodiments L1-L12 wherein the layers comprised of copper are at least 95 weight % copper.
CP1. A resin matrix-fiber composite part comprising the plated article according to any of embodiments TS1-TS52, B1-B13 or L1-L17.
CP2. A resin matrix-fiber composite part comprising the plated article according to any of embodiments TS1-TS52, B1-B13 or L1-L17 as a surface.
CP3. A resin matrix-fiber composite part comprising the plated article according to any of embodiments TS1-TS52, B1-B13 or L1-L17 as a surface, wherein the polymeric substrate forms the outermost surface of the resin matrix-fiber composite part.
CP4. A resin matrix-fiber composite part comprising the plated article according to any of embodiments TS1-TS52, B1-B13 or L1-L17 as a surface, wherein the polymeric substrate is bound directly to the resin matrix of the resin matrix-fiber part.

Objects and advantages of this disclosure are further illustrated by the following examples, but the particular materials and amounts thereof recited in these examples, as well as other conditions and details, should not be construed to unduly limit this disclosure.

EXAMPLES

Unless otherwise noted, all reagents were obtained or are available from Sigma-Aldrich Company, St. Louis, Mo., or may be synthesized by known methods. Unless otherwise reported, all ratios are by weight percent.

The following abbreviations are used to describe the examples:
A: Ampere
$A/dm^2$: Ampere per square decimeter
$A/ft^2$: Ampere per square foot
$A^2$ s: Ampere squared per second
° C.: degrees Centigrade
C: Coulomb
cm: centimeter
ft/min: feet per minute
kA: kiloAmpere
kPa: kiloPascal
kW: kiloWatt
mL: milliliter
m/min: meters per minute
micrometer
microsecond
msec: millisecond
Pa: Pascal
psi: pounds per square inch
rpm: revolutions per minute
sccm: standard cubic centimeters per minute Abbreviations for the materials used in the examples are as follows:
CU-2300B: A plating accelerator, obtained under the trade designation "CU-2300 BRIGHTENER" from Technics, Inc., Cranston, R.I.
CU-2300C: A plating suppressor, obtained under the trade designation "CU-2300 CARRIER" from Technics, Inc.
CSC: An aqueous copper (II) sulfate concentrate, obtained from Technics, Inc.
HCl: Hydrochloric acid
$H_2SO_4$: sulphuric acid
LT-M: An immersion tin plating solution, obtained under the trade designation "LEVELTECH MAKEUP) from Technics, Inc.
LT-S: An immersion tin stabilizer, obtained under the trade designation "LEVELTECH STABILZER" from Technics, Inc.
P-2353W: A uni-directional carbon fiber prepreg, obtained under the trade designation "TORAYCA PREPREG MATERIAL" from Toray Composites, Inc., Tacoma, Wash.

Sputter Coated Polymeric Substrate

A 30.5 by 30.5 cm by 6 mil (152.4 µm) sheet of polypropylene film, bearing a partially cured 7 mil (177.8 µm) epoxy coating, was sputter coated as follows. The sheet was first treated with oxygen plasma at 70 mTorr (9.33 Pa), 250 sccm, web speed 12 ft/min (0.37 m/min) and a current of 0.185 A, using a vacuum web coater. A tin layer was then applied at a pressure of 2 mTorr (0.27 Pa) of Argon, web speed 5 ft/min, and a power setting of 0.34 kW. A copper layer was then applied under similar conditions, wherein the power was increased to 1.32 kW. This alternating tin/copper seed layer was applied nine more times. A copper layer was then applied over the seed layer at a pressure of 2 mTorr (0.27 Pa), web speed 3.6 ft/min (0.11 m/min), power setting 3.2 kW. The copper layer was then applied seven more times. The cumulative thickness of the copper/tin seed layer and the copper cap layer were about 0.7 µm and about 0.4 µm, respectively.

Plating Solutions

A copper plating solution was prepared by mixing the following components, as a volume percent, to deionized water at 21° C.:

| | |
|---|---|
| CSC | 27.80 |
| H$_2$SO$_4$ | 10.00 |
| HCl | 0.02 |
| CU-2300B | 0.50 |
| CU-2300C | 0.75 |
| Deionized water | 60.93 |

A tin plating solution was prepared by mixing the following components, as a volume percent, at 21° C.:

| | |
|---|---|
| LTM | 82.0 |
| LTS | 18.0 |

Example 1

The sputter coated polymeric substrate was immersed in the copper plating solution at 75° F. (23.9° C.). The plating solution was mixed and filtered by means of a centrifugal pump while a direct current density of 20.0 A/ft$^2$ (9.29 A/dm$^2$) was applied for approximately 4.5 minutes. The sheet was removed from the copper plating solution, rinsed with deionized water for 30 seconds, then immersed in the tin plating solution at 72° F. (22.2° C.) for 6 minutes. The sheet was removed from the tin plating solution, again rinsed 30 seconds with deionized water, and the copper and tin plating process repeated two more times. Atomic absorption spectroscopy confirmed the sheet was uniformly coated with 3 alternating layers each of copper and tin, at a total thickness of 7 μm, and an overall ratio of 80 atomic percent copper and 20 atomic percent tin.

Example 2

The procedure of Example 1 was repeated, wherein the copper and tin plating times were 6.5 and 9 minutes, respectively. Atomic absorption spectroscopy confirmed the sheet was uniformly coated with 3 alternating layers each of copper and tin, at a total thickness of 10 μm, and an overall ratio of 80 atomic percent copper and 20 atomic percent tin.

Example 3

The procedure of Example 1 was repeated, wherein the tin plating time was 2.5 minutes. Atomic absorption spectroscopy confirmed the sheet was uniformly coated with 3 alternating layers each of copper and tin, at a total thickness of 7 μm, and an overall ratio of 90 atomic percent copper and 10 atomic percent tin.

Example 4

The procedure of Example 1 was repeated, wherein the copper and tin plating times were 6.5 and 3.5 minutes, respectively. Atomic absorption spectroscopy confirmed the sheet was uniformly coated with 3 alternating layers each of copper and tin, at a total thickness of 10 μm, and an overall ratio of 90 atomic percent copper and 10 atomic percent tin.

Plating conditions and the resulting copper/tin compositions are summarized in Table 1.

TABLE 1

| Example | Plating Time (minutes) | | Number of Layers (Copper/Tin) | Total Plating Thickness (μm) | Atomic % Copper | Atomic % Tin |
|---|---|---|---|---|---|---|
| | Copper | Tin | | | | |
| 1 | 4.5 | 6.0 | 3/3 | 7 | 80 | 20 |
| 2 | 6.5 | 9.0 | 3/3 | 10 | 80 | 20 |
| 3 | 4.5 | 2.5 | 3/3 | 7 | 90 | 10 |
| 4 | 6.5 | 3.5 | 3/3 | 10 | 90 | 10 |

Composite Fabrication

The plated substrates of Examples 1-4 were fabricated onto carbon fiber composite panels as follows. The plated substrates were etched in an acid/iron (III) chloride solution, rinsed, dried and trimmed to 10.5 by 10.5 inch (26.7 by 26.7 cm). The non-plated side of the Example was then coated with an epoxy adhesive and laid, adhesive coated side face up, on a vacuum table. Twelve sheets of similar sized P2353W were laid sequentially on top of the epoxy coating, orientated at 45/0/135/90/0/90/90/0/90/135/0/45 degrees, and a vacuum of 25 inches of mercury (84.7 kPa) applied for approximately 5 to 10 minutes to each sheet as it is applied in order to consolidate the sheets. The layup was placed in a vacuum bag and the bag placed in an autoclave obtained from ASC Process Systems, Valencia, Calif. A vacuum of approximately 28 inches mercury (94.8 kPa) was applied to the inside of the bag for 10 to 15 minutes at 72° F. (22.2° C.), after which the external pressure was gradually increased to 55 psi (397 kPa). The vacuum inside the bag was maintained at 94.8 kPa and the temperature increased at a rate of 5° F. (2.8° C.) per minute until reaching 350° F. (176.7° C.). This temperature was held for 2 hours, after which the temperature was returned to 72° F. (22.2° C.), the pressure released and the cured composite article removed from the vacuum bag.

Evaluations

The carbon fiber composite panels were subjected to lightning strike tests according to SAE ARP5416 "Aircraft Lightning Test Methods", Section 5.2, under the following conditions prescribed for Zone 2A in SAE ARP5412 "Aircraft Lightning Environment and Related Test Forms" for current components D, B and $C_{mod}$:

D: Peak 100 kA
　0.25×10$^6$ A$^2$ s
　500 μs
B: Mean 2 kA
　10 C
$C_{mod}$: 400 A
　18 C Observed results were as follows:

Example 1: Surface epoxy layer ablated. Conductor partially ablated, but unbroken. No exposed substrate.
Example 2: Surface epoxy layer ablated. Conductor partially ablated, but unbroken. No exposed substrate.
Example 3: Surface epoxy layer ablated. Conductor partially ablated, but unbroken. No exposed substrate.
Example 4: Surface epoxy layer ablated. Conductor partially ablated, but unbroken. No exposed substrate.

Various modifications and alterations of this disclosure will become apparent to those skilled in the art without departing from the scope and principles of this disclosure, and it should be understood that this disclosure is not to be unduly limited to the illustrative embodiments set forth hereinabove.

We claim:

1. A plated article comprising
   a) a polymeric substrate bearing
   b) a tie/seed layer in direct contact with the polymeric substrate and
   c) a plated metal layer,
   wherein the tie/seed layer has a thickness of less than 0.95 μm,
   wherein the tie/seed layer comprises two or more layers of tin alternating with two or more layers of copper,
   wherein the layers of tin comprising the tie/seed layer are sputter coated layers and the layers of copper comprising the tie/seed layer are sputter coated layers and wherein the plated metal layer comprises copper and tin in an atomic ratio of greater than 65:35.

2. The plated article according to claim 1 wherein the tie/seed layer comprises five or more layers of tin alternating with five or more layers of copper.

3. The plated article according to claim 1 wherein the tie/seed layer includes a layer of tin in direct contact with the polymeric substrate.

4. The plated article according to claim 1 wherein the plated metal layer is in direct contact with the tie/seed layer.

5. The plated article according to claim 1 wherein the tie/seed layer bears a sputter coated top layer of copper having in direct contact with the tie/seed layer, wherein the top layer of copper has a thickness of less than 0.60 μm.

6. The plated article according to claim 5 wherein the plated metal layer is in direct contact with the top layer of copper.

7. The plated article according to claim 1 wherein the plated metal layer comprises copper and tin in an atomic ratio of less than 96:4.

8. The plated article according to claim 1 wherein the plated metal layer comprises copper and tin in an atomic ratio of less than 87:13.

9. The plated article according to claim 1 wherein the plated metal layer comprises copper and tin in an atomic ratio of less than 82:18.

10. The plated article according to claim 1 wherein the polymeric substrate comprises a thermoplastic polymer.

11. The plated article according to claim 1 wherein the polymeric substrate comprises a polymer derived from an epoxy resin.

12. The plated article according to claim 1 wherein the plated metal layer comprises an alloy of copper and tin having a melting point of less than 800° C.

13. The plated article according to claim 1 wherein the plated metal layer comprises layers comprised of tin alternating with layers comprised of copper.

14. The plated article according to claim 13 wherein the plated metal layer comprises at least two layers comprised of tin and at least two layers comprised of copper.

15. A resin matrix-fiber composite part comprising the plated article according to claim 1 as a surface, wherein the polymeric substrate forms the outermost surface of the resin matrix-fiber composite part.

16. A resin matrix-fiber composite part comprising the plated article according to claim 1 as a surface, wherein the polymeric substrate is bound directly to the resin matrix of the resin matrix-fiber part.

17. The plated article according to claim 1 wherein the plated metal layer comprises copper and tin in an atomic ratio of greater than 68:32.

\* \* \* \* \*